United States Patent
Rolandi et al.

(10) Patent No.: US 6,476,664 B2
(45) Date of Patent: Nov. 5, 2002

(54) INTEGRATED DEVICE WITH VOLTAGE SELECTOR

(75) Inventors: Paolo Rolandi, Voghera (IT); Massimo Montanaro, Pavia (IT); Giorgio Oddone, Rossiglione (IT)

(73) Assignee: STMicroelectronics, S.r.l., Agrate Brianza (IT)

(*) Notice: Subject to any disclaimer, the term of this patent is extended or adjusted under 35 U.S.C. 154(b) by 0 days.

(21) Appl. No.: 09/823,262

(22) Filed: Mar. 29, 2001

(65) Prior Publication Data
US 2001/0052810 A1 Dec. 20, 2001

(30) Foreign Application Priority Data
Mar. 29, 2000 (EP) .............................. 00830239

(51) Int. Cl.[7] ................................................ G05F 1/10
(52) U.S. Cl. ...................................... 327/534; 327/530
(58) Field of Search ................................. 327/530, 534, 327/537, 538, 536, 545

(56) References Cited

U.S. PATENT DOCUMENTS

| 5,003,511 | A | * | 3/1991 | Secol et al. .................. 365/226 |
| 6,232,827 | B1 | * | 5/2001 | De et al. ........................ 327/537 |
| 6,252,536 | B1 | * | 6/2001 | Johnson et al. .............. 330/253 |

FOREIGN PATENT DOCUMENTS

| EP | 0322002 A2 | 6/1989 |
| EP | 0961288 A1 | 12/1999 |
| WO | WO96/23307 | 8/1996 |

* cited by examiner

Primary Examiner—Dinh T. Le
(74) Attorney, Agent, or Firm—Lisa K. Jorgenson; Robert Iannucci; Seed IP Law Group PLLC

(57) ABSTRACT

The integrated device comprises a PMOS transistor and a voltage selector having an output connected to the bulk terminal of the PMOS transistor. The voltage selector comprises an input stage supplying a supply voltage or a programming voltage according to whether the device is in a reading step or in a programming step; a comparator connected to the output of the input stage, receiving a boosted voltage, and generating a first control signal, the state whereof depends upon the comparison of the voltages at the inputs of the comparator; a logic circuit connected to the output of the comparator and generating a second control signal, the state whereof depends upon the state of the first control signal and of a third-level signal; and a switching circuit controlled by the first control signal, by the second control signal, and by the third-level signal and supplying each time the highest among the supply voltage, the boosted voltage, and the programming voltage.

17 Claims, 5 Drawing Sheets

US 6,476,664 B2

INTEGRATED DEVICE WITH VOLTAGE SELECTOR

TECHNICAL FIELD

The present invention refers to an integrated device, in particular to a nonvolatile memory, with a voltage selector.

BACKGROUND OF THE INVENTION

As is known, the increasing demand for high-density nonvolatile memories has led to the design of nonvolatile memory structures having architectures with high storage capacity and high compactness; in particular, the most recent developments have evolved from a two-level architecture towards a multilevel architecture.

This increase in storage capacity has led to an increase in circuit complexity. In particular, a nonvolatile memory comprises a memory array receiving different voltages during the different operative steps, such as reading and programming. In nonvolatile memories with a two-level architecture (which will hereinafter be referred to as "two-level memories"), one reading voltage Vdd is supplied during reading, and one programming voltage Vpp is supplied during programming.

Nonvolatile memories with multilevel architecture (which will hereinafter be referred to as "multilevel memories") instead require a larger number of voltages. In fact, multilevel memories need different voltage values for each one of reading and programming. In particular, for example, during reading, certain parts of the memory are supplied with the reading voltage Vdd or with a boosted voltage Vboost (generated by a charge pump), while during programming the reading voltage Vdd, the boosted voltage Vboost and/or the programming voltage Vpp are required.

During each of the above-mentioned steps, the memory array (generally fabricated using an N-channel CMOS technology) is supplied by a voltage transmitted through switches formed by PMOS transistors, preferred to NMOS transistors in that they transmit positive voltages free from voltage drops. Unfortunately, PMOS transistors require, during their operation, inverse biasing of the drain and source regions with respect to the substrate. In fact, direct biasing of the above-mentioned regions may determine an injection of currents into the substrate and, consequently, latch-up phenomenon (i.e., undesired turning-on of parasitic components).

In order to prevent latch-up, devices are used that at each instant bias the N regions, and in particular the substrates of the selectors, at the maximum potential fed to the PMOS transistor during each one of the different operative steps.

An example of a device for the selection of the highest voltage in a nonvolatile memory of a known type is described in EP-A-0 961 288.

This known device comprises two PMOS transistors. The PMOS transistors each receive on a first terminal two input voltages which, at least in certain operative conditions, may be different, and are connected to each other at a second terminal. A biasing circuit supplies the substrate of the PMOS transistors with the highest voltage among the input voltages.

The known integrated device has the drawback to be operative only within a limited voltage range. In particular, in the known integrated device, the reading voltage Vdd and programming voltage Vpp must be strictly greater than zero. In addition, a reading voltage Vdd having a value greater than 3 V and/or greater than Vboost cannot be used.

The integrated device described above has an unstable operation in the transient from Vpp to Vboost. In greater detail, when the programming voltage Vpp reaches the boosted voltage Vboost, the characteristics of some components of the integrated device vary, due to the presence of a positive feedback loop.

SUMMARY OF THE INVENTION

An embodiment of the present invention provides an integrated device configured to select the highest voltage, from among such as may be available, to bias memory cells.

The integrated device comprises a PMOS transistor and a voltage selector having an output connected to the bulk terminal of the PMOS transistor. The voltage selector comprises an input stage supplying a supply voltage or a programming voltage according to whether the device is in a reading step or in a programming step. A comparator connected to the output of the input stage, receives a boosted voltage, and generates a first control signal, whose state depends upon the comparison of the voltages at the inputs of the comparator. A logic circuit is connected to the output of the comparator and generates a second control signal, the state whereof depends upon the state of the first control signal and of a third-level signal. A switching circuit is controlled by the first control signal, by the second control signal, and by the third-level signal and supplies each time the highest among the supply voltage, the boosted voltage, and the programming voltage.

The invention has many advantages, among them that parasitic latching is reduced, or prevented altogether. It also provides greater reliability in the storage and retention of data.

BRIEF DESCRIPTION OF THE DRAWINGS

For a better understanding of the present invention, an embodiment thereof is now described, as a non-limiting example, with reference to the attached drawings, wherein.

DETAILED DESCRIPTION OF THE INVENTION

Figure 1:
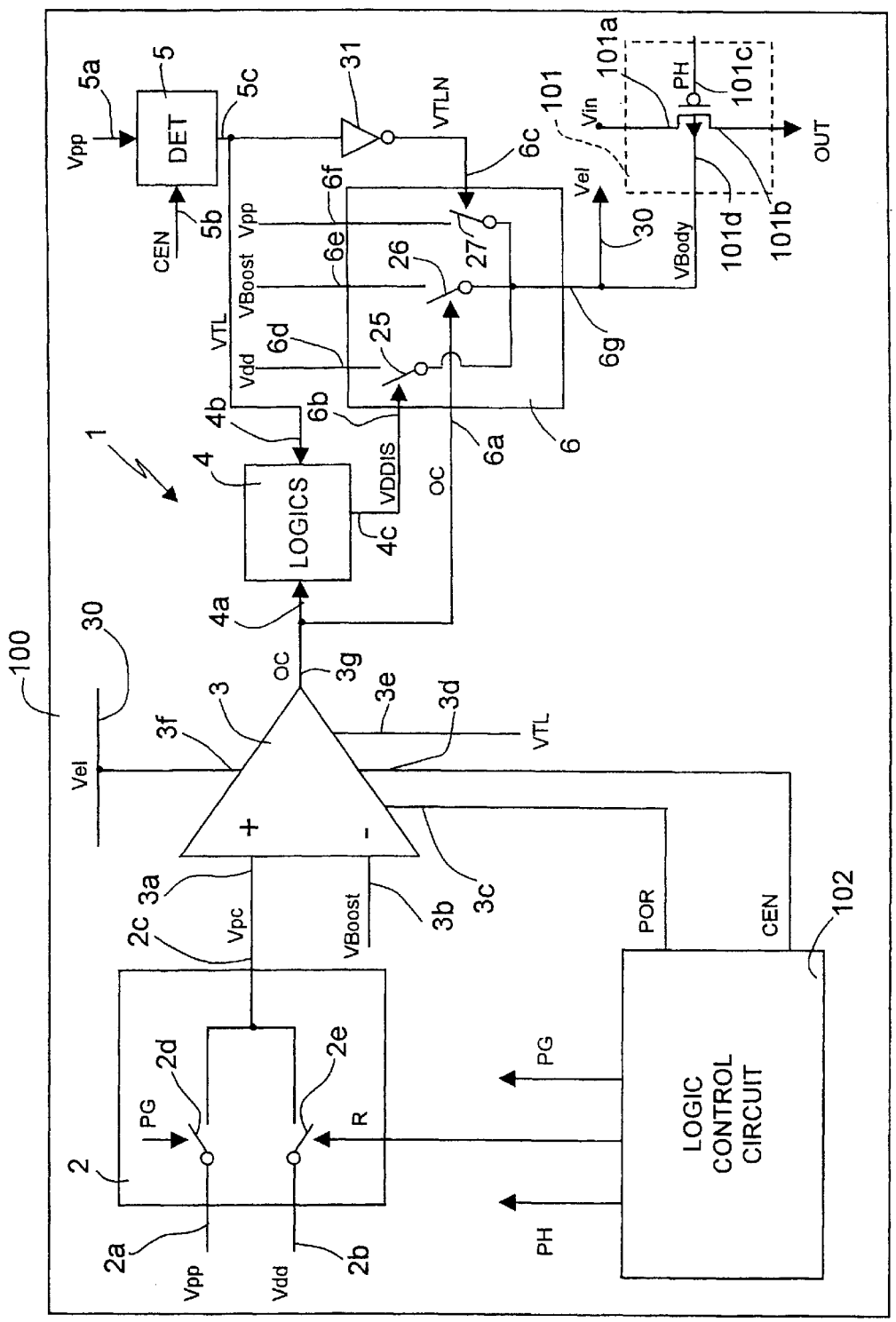
FIG. 1 is a block diagram of an integrated device according to the invention.

With reference to FIG. 1, a nonvolatile memory 100 comprises a voltage selector 1, a switching element 101, and a logic control circuit 102. The switching element 101, formed by a PMOS transistor, has an input terminal 101a receiving an input voltage Vin, the value whereof is determined by the operative step of the nonvolatile memory 100; an output terminal 101b connected to a word line of a memory array (not shown); a control terminal 101c receiving a control signal PH supplied by the logic control circuit 102; and a bulk terminal 101d receiving a biasing voltage Vbody.

The voltage selector 1 comprises an input stage 2, a comparator 3, a control logic 4, a third-level detector 5, and a switching circuit 6.

The input stage 2 comprises a first input 2a receiving a programming voltage Vpp, a second input 2b receiving a first supply voltage Vdd, and an output 2c supplying a voltage Vpc. A first switch 2d is coupled between the first input 2a and the output 2c of the input stage 2, and has a control terminal receiving a programming signal PG generated by the logic control circuit 102; a second input 2e is connected between the second input 2b and the output 2c of the input stage 2 and has a control terminal receiving a read signal R generated by the logic control circuit 102.

The comparator 3 (the structure whereof is shown in detail in FIG. 2) has a non-inverting input 3a connected to the output 2c of the input stage 2, an inverting input 3b receiving a boosted voltage Vboost, a first control input 3c receiving a power-up signal POR, a second control input 3d receiving a first enable signal CEN, and a third control input 3e receiving a third-level signal VTL.

Finally, the comparator 3 has a supply input 3f connected to a supply line 30 supplying a second supply voltage Vel, and an output 3g supplying a first control signal OC.

The logic 4 has a first input 4a connected to the output 3g of the comparator 3, a second input 4b receiving the third-level signal VTL, and an output 4c supplying a second control signal VDDIS.

Figure 4:
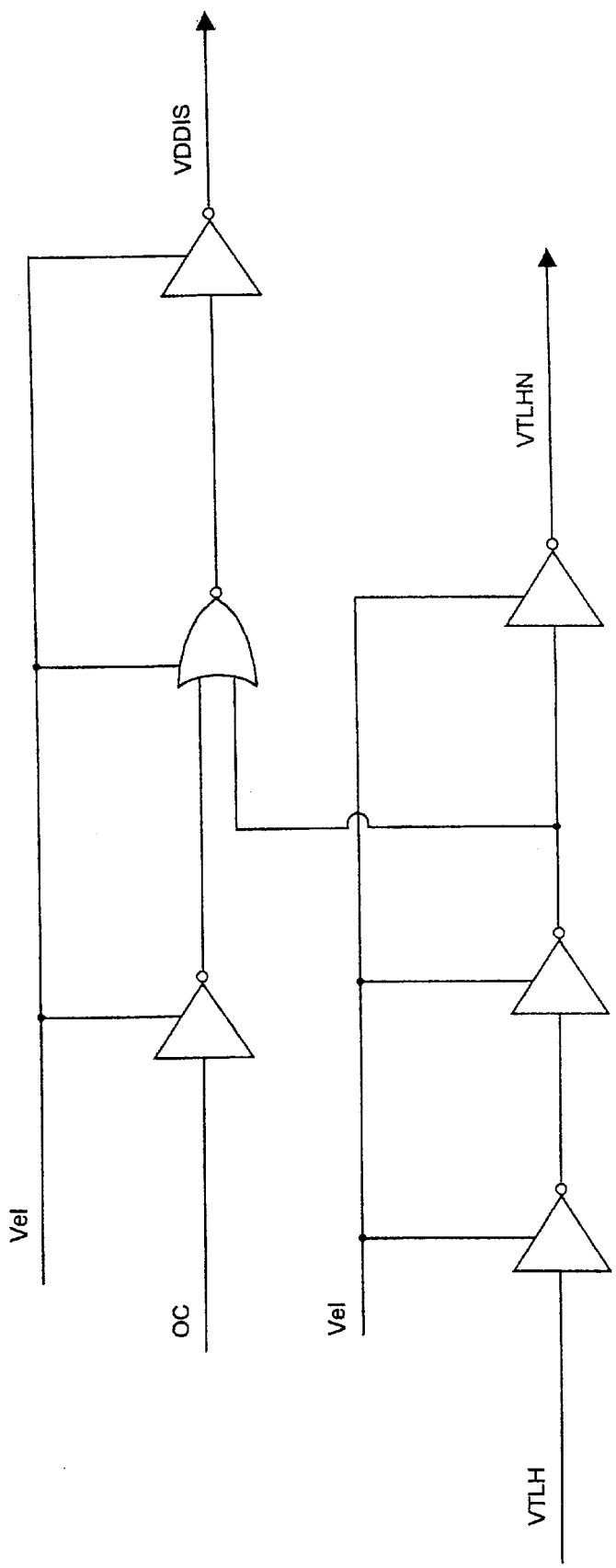
FIG. 4 is a circuit diagram of a further part of the device of FIG. 1.

The logic 4 (illustrated in detail in FIG. 4) is configured so that the second control signal VDDIS on the output 4c is at a low logic level only when the first control signal OC is at a high logic level and the third-level signal VTL is at a low logic level. In all the other cases, the second control signal VDDIS is at a high logic level.

The switching circuit 6 comprises a first control input 6a connected to the output 3g of the comparator 3; a second control input 6b connected to the output 4c of the logic 4; a third control input 6c receiving an inverted third-level signal VTLN; a first supply input 6d receiving the first supply voltage Vdd; a second supply input 6e receiving the boosted voltage Vboost; and a third supply input 6f receiving the programming voltage Vpp.

The first, second and third supply inputs 6d, 6e, 6f are connected to an output 6g via a respective third, fourth and fifth switch 25, 26, 27 controlled by the signals VDDIS, OC and VTLN supplied to the control inputs 6b, 6a, 6c of the switching circuit 6. The switches 25, 26, 27 are closed when the respective control signals VDDIS, OC, VTLN are at a low logic level; otherwise, they are open.

The output 6g of the switching circuit 6 is connected to the bulk terminal 101d of the switching element 101 and to the supply line 30.

The third-level detector 5 has a first input 5a receiving the programming voltage Vpp, a second input 5b receiving the first enable signal CEN, and an output 5c supplying the third-level signal VTL to the comparator 3, to logics 4, and to an inverter 31 supplying the inverted third-level signal VTLN to the switching circuit 6.

Figure 3:
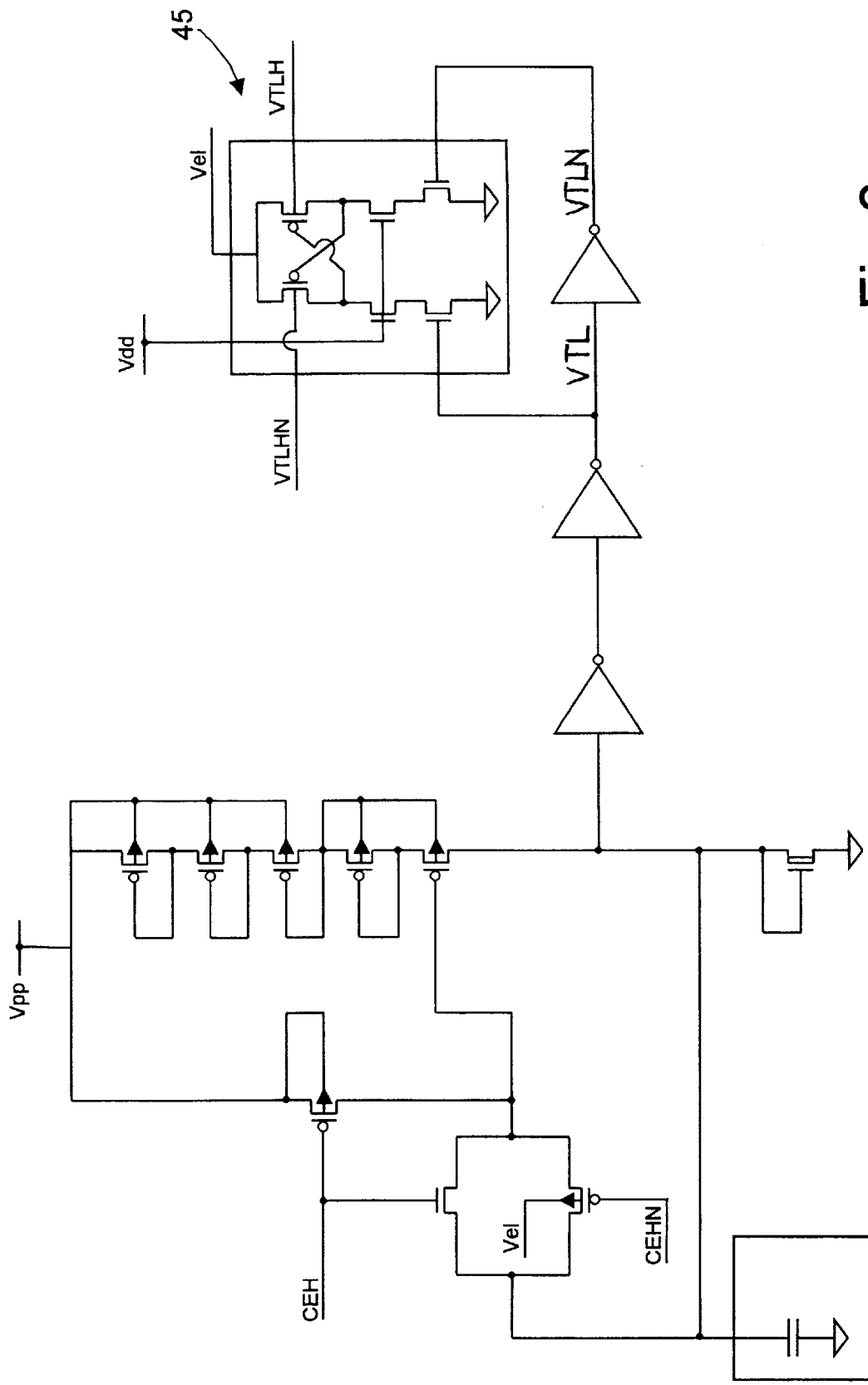
FIG. 3 is a circuit diagram of another part of the device of FIG. 1.

The third-level detector 5 (the detailed structure whereof is shown in FIG. 3) is sensitive to a given value of the programming voltage Vpp, for example 12 V; in this condition, the third-level signal VTL is high. The third-level signal VTL is instead low when the programming voltage Vpp is lower than 12 V.

Operation of the voltage selector 1 is described hereinafter.

Upon turning-on of the nonvolatile memory 100, after the first enable signal CEN has reached a low logic level, the logic control circuit 102 causes a brief switching of the power-up signal POR, which thus has a short pulse in the high logic state.

In this condition, the comparator 3 sends the first control signal OC on the output 3g to the high logic level; in addition, the third-level signal VTL is low; hence, the inverted third-level signal VTLN is high, and the second control signal VDDIS is low. Consequently, the third switch 25 is closed, and the fourth switch 26 and fifth switch 27 are open, and the output 6g of the switching circuit 6 is set at the first supply voltage Vdd which is supplied both to the bulk terminal 101d of the switching element 101 and to the supply input 3f of the comparator 3.

At the end of the pulse of the power-up signal POR, the nonvolatile memory 100 begins reading. Now, the read signal R is high, the programming signal PG is low, the programming voltage Vpp has a lower value than the preset value, and the boosted voltage Vboost has a low value. The third-level signal VTL remains low, and the inverted third-level signal VTLN remains high.

In this phase, the programming signal PG keeps the first switch 2d open, and the read signal R keeps the second switch 2e of the input stage 2 closed. Consequently, the voltage Vpc on the output 2c of the input stage 2 is equal to the first supply voltage Vdd and is compared with the boosted voltage Vboost.

If the first supply voltage Vdd is greater than the boosted voltage Vboost, the first control signal OC on the output 3g of the comparator 3 has a high logic level. Consequently, analogously to the above, the second control signal VDDIS is low, and the inverted third-level signal VTLN is high; the third switch 25 is closed, and the fourth switch 26 and fifth switch 27 are open. The output 6g of the switching circuit 6 thus remains at the first supply voltage Vdd.

If, during reading, the boosted voltage Vboost reaches a higher value than the first supply voltage Vdd, the comparator 3 switches, and the first control signal OC on its own output 3g switches to low. In addition, since the third-level signal VTL is at a low logic level, the logic 4 brings the second control signal VDDIS on its own output 4c to the high logic level.

Consequently, the fourth switch 26 closes, and the third switch 25 and fifth switch 27 open, thus the biasing voltage Vbody and the second supply voltage Vel reach a value equal to the boosted voltage Vboost, supplied to the bulk terminal 101d of the switching element 101 and to the supply terminal 3f of the comparator 3.

If the boosted voltage Vboost falls again to a lower value than the first supply voltage Vdd, the selector circuit 1 switches again, supplying the first supply voltage Vdd to the bulk terminal 101d of the switching element 101 and to the supply terminal 3f of the comparator 3.

During programming, the programming signal PG controls closure of the first switch 2d, and the read signal R controls opening of the second switch 2e of the input stage 2. Consequently, the voltage Vpc on the non-inverting input of the comparator 3 is equal to the programming voltage Vpp.

In this phase, the programming voltage Vpp switches to a high value, for example 12 V. Consequently, the third-level detector 5 detects this transition and brings the third-level signal VTL to the high logic level, and the inverted third-level signal VTLN to the low logic level. In addition, the comparator 3, receiving on its first non-inverting input the voltage Vpc having a value equal to the programming voltage Vpp and higher than the boosted voltage Vboost, causes the first control signal OC on its own output 3g to switch to high. The fourth switch 26 is thus open.

The logic 4, receiving the high level of the third-level signal VTL, brings the second control signal VDDIS on its own output 4c to the high logic level, thus determining the third switch 25 to open; instead, the low level of the inverted third-level signal VTLN determines the fifth switch 27 to close.

Then the output 6g of the switching circuit 6 and, consequently, the biasing voltage Vbody and the second supply voltage Vel reach the value of the programming voltage Vpp.

In this phase, as will be described in detail later, biasing of the comparator 3, supplied by a very high programming voltage Vpp, is modified via the third-level signal VTL.

Figure 5:
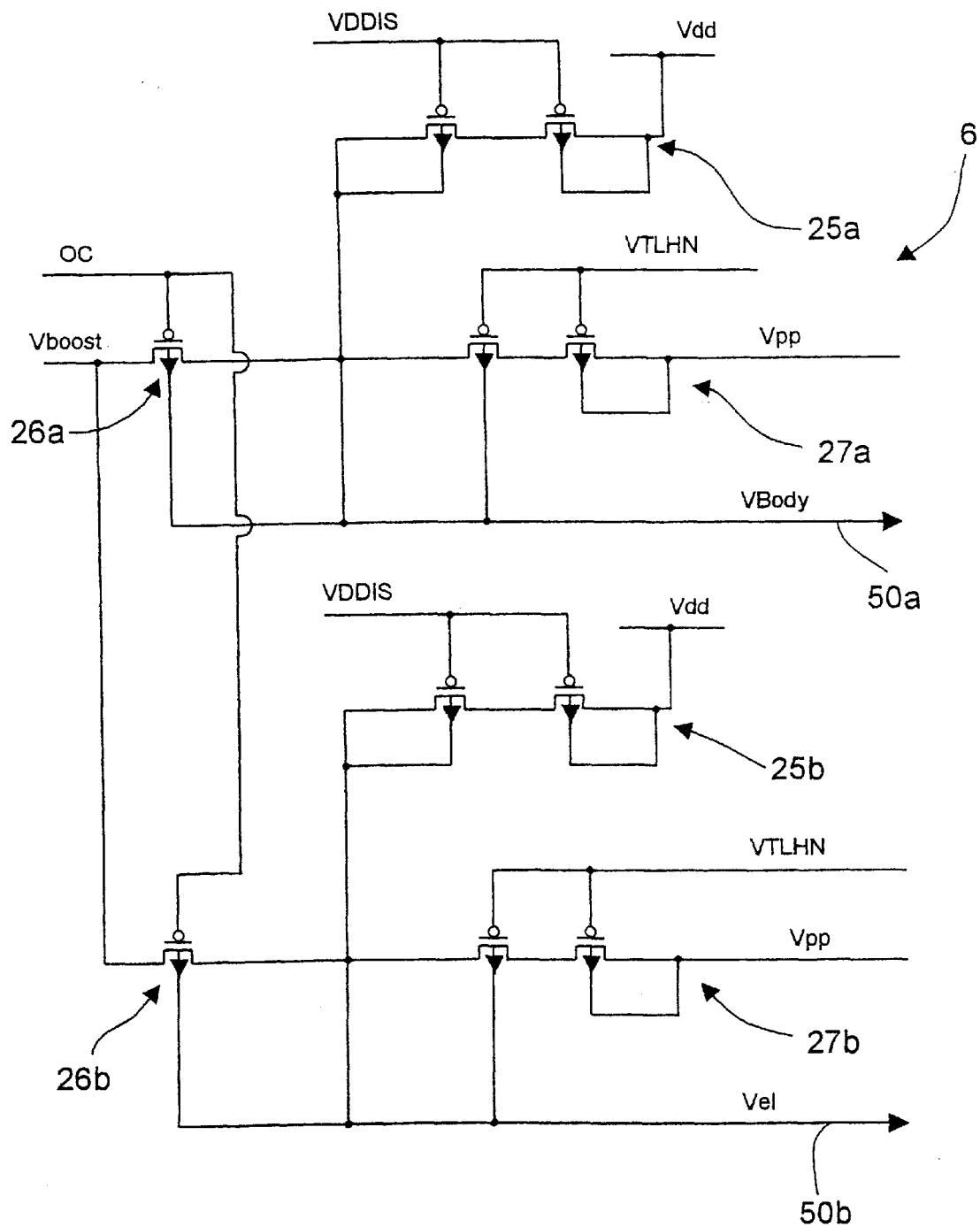
FIG. 5 is a circuit diagram of another part of the device of FIG. 1.

Advantageously, as shown in FIG. 5, the switches 25–27 are duplicated (switches 25a, 25b, 26a, 26b, 27a, 27b) and are connected to two different outputs 50a, 50b of the switching circuit 6, which are connected, respectively, to the bulk terminal 101d and to the supply line 30. The two outputs 50a, 50b are therefore set at a same voltage, as previously described, according to the specific operative step, but physically isolate the bulk terminal 101d from the supply line 30. In this way, during transition from reading to programming, when the voltage Vbody on the bulk terminal 101d has maximum dynamics, the capacitive load connected to the bulk terminal 101d cannot cause noise on the supply line 30, and thus cannot jeopardize the precision of the comparator 3.

Figure 2:
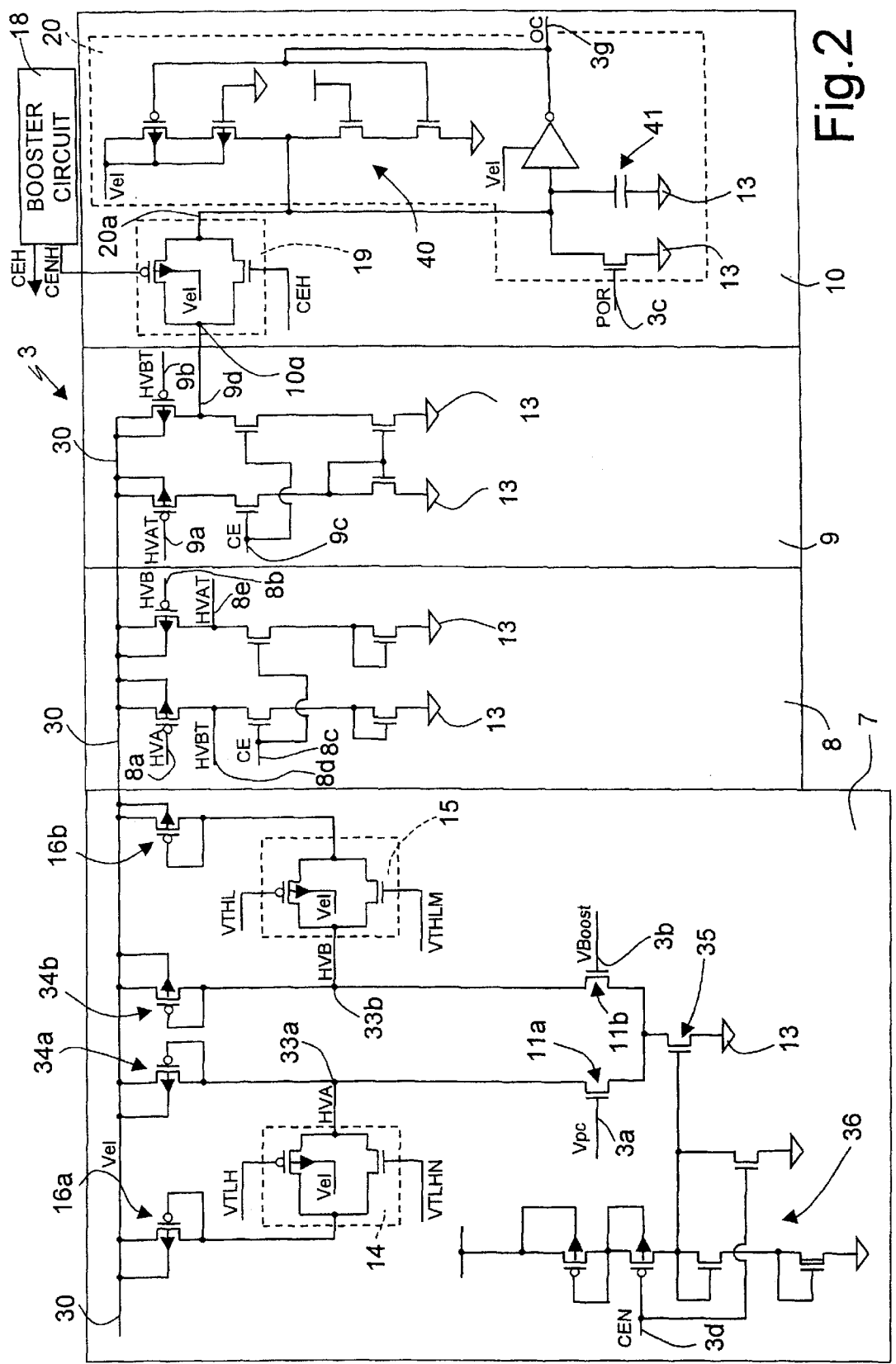
FIG. 2 is a circuit diagram of one part of the device of FIG. 1.

With reference to FIG. 2, the comparator 3 comprises a differential stage 7, a first gain stage 8, a second gain stage 9, and a stabilizer stage 10, arranged in cascade to each other.

The differential stage 7 is connected between the supply line 30 set at the second supply voltage Vel and a ground line 13, and comprises a first and a second NMOS transistor 11a, 11b, having own gate terminals forming, respectively, the first non-inverting input 3a and the second inverting input 3b of the comparator 3, their drain terminals connected, respectively, to a first node 33a and to a second node 33b, and their source terminals connected to the ground line 13 via a supply transistor 35, of NMOS type. The differential stage 7 moreover comprises a first PMOS load transistor 34a, connected between the first node 33a and the supply line 30, and a second PMOS load transistor 34b, connected between the node 33b and supply line 30.

The first node 33a and second node 33b form the outputs of the differential stage 7 and respectively supply a first differential signal HVA and a second differential signal HVB. The first and second nodes 33a and 33b are moreover connected to the supply line 30, respectively via a first and a second CMOS switches 14, 15, and respectively via a third and a fourth PMOS load transistor 16a, 16b.

The first and second CMOS switches 14 and 15 are controlled by a switching signal VTLH and an inverted switching signal VTLHN generated from the third-level signal VTL and from the inverted third-level signal VTLN via a booster circuit (designated at 45 in FIG. 3), which brings the third-level signal VTL and the inverted third-level signal VTLN to a voltage value compatible with the comparator 3 and correlated to the second supply voltage Vel.

Finally, the differential stage 7 comprises an enable inverter 36 connected between the first enable input 3d of the comparator 3 (and hence receiving the first enable signal CEN) and the gate terminal of the supply transistor 35.

The first gain stage 8 is connected between the supply line 30 and the ground line 13 and has a first and a second inputs 8a, 8b which receive, respectively, the first and the second differential signals HVA, HVB. The first gain stage 8 has a third input 8c receiving a second enable signal CE, opposite to the first enable signal CEN, a first and a second outputs 8d, 8e supplying, respectively, a first and a second amplified signal HVBT, HVAT.

The second gain stage 9 is connected between the supply line 30 and the ground line 13 and has a first and a second inputs 9a, 9b receiving, respectively, the second and the first amplified signals HVAT, HVBT, a third input 9c receiving the second enable signal CE, and an output 9d connected to a first input 10a of the stabilizer stage 10.

The stabilizer stage 10 comprises a booster circuit 18 of known type (having a structure similar to that of the booster circuit 45 used for the third-level signal VTL and shown in FIG. 3), a third CMOS switch 19, and a stabilizer circuit 20.

The booster circuit 18 supplies at the output a high enable signal CEH and an inverted high enable signal CENH of logic type and having a value compatible with the stage 10, in particular a value correlated to the second supply voltage Vel.

The third CMOS switch 19 is identical to the first and second CMOS switches 14 and 15 described previously, and is controlled by the high enable signal CEH and by the inverted high enable signal CENH.

The CMOS switch 19 is connected between the output 9d of the second gain stage 9 and a first input 20a of the stabilizer circuit 20, which has an output terminal defining the output 3g of the comparator 3.

The stabilizer circuit 20 has a further terminal defining the third input 3c of the comparator 3 and receiving the power-up signal POR. In detail, the stabilizer circuit 20 comprises a latch circuit 40 and a capacitor 41. The latch circuit 40 is connected between the first input 20a of the stabilizer circuit 20 and the output 3g of the comparator 3. The capacitor 41 is connected between the first input 20a of the stabilizer circuit 20 and the ground line 13, and ensures the stability of the voltage selector 1, in particular as regards the loop including the comparator 3, the logic 4, the switching circuit 6, the supply line 30, and the supply input 3f of the comparator 3.

The comparator 3 is enabled by the first and second enable signals CEN, CE. More precisely, when the first and second enable signals CE, CEN are, respectively, at a low logic level and at a high logic level, they enable the differential stage 7, and the first and second gain stages 8, 9 of the comparator 3, and connect the stabilizer stage 10 to the previous stages.

In presence of the pulse of the power-up signal POR, the input 20a of the latch circuit 20 is kept at a voltage close to the ground voltage, and thus the output 3g of the comparator 3 is forced to the high logic state.

At the end of the pulse of the power-up signal POR, the comparator 3 becomes effectively operative. In this phase, biasing of the comparator 3 is varied according to the value of the second supply voltage Vel. In particular, when the third-level signal VTL, and thus the switching signal VTLH, is at a low logic level (the programming voltage Vpp is lower than the preset triggering value of the third-level detector 5), the CMOS switches 14 and 15 are closed and connect the third load transistor 16a in parallel with the first load transistor 34a, and the fourth load transistor 16b in parallel with the second load transistor 34b. The nodes 11a, 11b thus receive a first load level, because of the parallel connection of two resistive elements.

Instead, when during programming the third-level signal VTL is high, and thus the switching signal VTLH is high, the first and second CMOS switches 14 and 15 are open, and disconnect the third and fourth load transistors 16a, 16b from the nodes 11a, 11b. The nodes 11a, 11b thus see a higher load than previously, so increasing the dynamics of the comparator 3.

The first and second gain stages 8 and 9 increase the gain, and consequently reduce the response time of the comparator 3. The stabilizer stage 10 has the purpose of supplying a signal (first control signal OC) with high dynamics and fast, the amplitude and form whereof are independent of any possible noise superimposed on the input signals. In detail, thanks to the latch circuit 40, the stabilizer circuit 20 prevents the first control signal OC from changing the logic level as a result of any noise present in the comparator 3.

The voltage selector 1 illustrated herein affords the following advantages. First, it may select the highest voltage independently of its value; in particular, it operates correctly even for voltages to be compared that are equal to 0 V and higher than 3 V (typically, the 12 V programming voltage).

The present selector 1 may select the maximum voltage from a plurality of input voltages (supply voltage Vdd, boosted voltage Vboost, programming voltage Vpp). In addition, it has high flexibility and is sensitive to the operative step, in particular as regards the power-up step (presence of the pulse of the power-up signal).

The present voltage selector 1 is stable, since the dynamics of the comparator 3 may be increased in presence of a high voltage.

The selector 1 thus has a high speed and high precision, at the cost of just a slight increase in overall dimensions.

Finally, numerous modifications and variations may be made to the integrated device described herein, all falling within the scope of the invention, as defined in the claims.

What is claimed is:

1. An integrated device comprising:
    a switching element having a bulk terminal; and
    a voltage selector circuit that includes:
        first and second selector inputs, receiving a first and a second voltage, respectively;
        an output connected to said bulk terminal of said switching element;
    an input stage having a first voltage input and a second voltage input, a control input, and an output, said first and second voltage inputs being connected to said first and second selector inputs of said voltage-selector circuit, respectively, and said control input receiving a first operative condition signal to control selective connection of one of said first and second voltage inputs to said output;
    a comparator having a first input connected to said output of said input stage, a second input receiving a third voltage, and an output generating a first control signal having a first level when said first input is at a higher voltage than said second input and having a second level when said second input is at a higher voltage than said first input;
    a logic circuit receiving said first control signal and a second operative condition signal, said logic circuit generating a second control signal having a first level when said first control signal has said second level and when said second operative condition signal has a preset level; and
    a switching circuit receiving said first voltage, said second voltage and said third voltage, said first control signal and second control signal, as well as said second operative condition signal, said switching circuit having an own output connected to said output of said voltage-selector circuit and supplying, on said own output, said second voltage in presence of said first level of said second control signal, said first voltage in presence of said preset level of said second operative condition signal, and said third voltage in presence of said first level of said first control signal.

2. The integrated device of claim 1, wherein said comparator comprises a control input receiving a third control signal correlated to said second operative condition signal, said comparator means having a first biasing value in presence of a preset level of said third control signal, and a second biasing value increasing the dynamics of said first control signal, in absence of said third control signal.

3. The integrated device of claim 2, further comprising a level translator having an output receiving said second operative condition signal, a supply input connected to said output of said voltage selector circuit, and an output supplying said third control signal.

4. The integrated device of claim 2 wherein said comparator comprises a differential stage defining said first and second inputs of said comparator, a gain stage cascade-connected to said differential stage, and a stabilizer stage, said differential stage being of switchable-load type.

5. The integrated device of claim 4, wherein said differential stage comprises first and second nodes connected to said gain stage;
    a first load element connected between a supply line and said first node;
    a second load element connected between a supply line and said second node; a third load element connected between said supply line and said first node;
    a fourth load element connected between said supply line and said second node;
    first switching means connected between said third load element and said first node;
    second switching means connected between said fourth load element and said second node; and
    said first switching means and second switching means being controlled by said third control signal.

6. The integrated device of claim 5, wherein said supply line is connected to said output of said voltage-selector circuit.

7. The integrated device according to claim 1, further comprising third-level detecting means having an input terminal receiving said second voltage, and an output terminal supplying said second operative condition signal.

8. The integrated device according to claim 1, wherein said first voltage is a supply voltage, said second voltage is a programming voltage, and said third voltage is a boosted voltage.

9. The integrated device according to claim 1, wherein said input stage comprises a first switching means coupled between said first voltage input and said output of said input stage and receiving a programming signal; and a second switching means coupled between said second voltage input and said output of said input stage and receiving a read signal.

10. The integrated device according to claim 1, wherein said switching circuit comprises two outputs, one of which is the own output and three pairs of switching elements, each pair including a first and a second switching element each having a first terminal connected to a same input and a second terminal connected to a different one of the outputs of said switching circuit.

11. A voltage selector circuit comprising:

first and second input terminals;

an output terminal;

an input circuit having first and second inputs that are coupled to the first and the second input terminals, respectively, and having a first control input, and an output;

a comparator circuit having first and second comparator inputs, and a comparator output, the first comparator input coupled to the output of the input circuit, the second comparator input coupled to a third input terminal;

a logic circuit having first and second logic inputs and a logic output, the first logic input coupled to the comparator output, the second logic input coupled to a second control input; and a switching circuit having a first switching input coupled to the first input terminal, a second switching input coupled to the second input terminal, a third switching input coupled to the third input terminal, a fourth switching input coupled to the comparator output, a fifth switching input coupled to the logic output, a sixth switching input coupled to the second control input, and a switching output coupled to the output terminal.

12. The device according to claim 11, wherein the input circuit comprises means for selectively coupling the first or second input to the output, and wherein the means are controlled by a plurality of control inputs, including the first control input and a third control input.

13. The voltage selector circuit according to claim 11, further comprising a detector circuit with a detector input coupled to the first input terminal and a detector output coupled to the second control input, and configured to generate a first detector logic level at the detector output when a voltage level at the first input terminal is lower than a preset level, and configured to generate a second detector logic level at the detector output when the voltage level at the first input terminal is greater than the preset level.

14. The device of claim 11, wherein the comparator circuit is configured to generate a first comparator level at the comparator output when the first comparator input is at a higher voltage than the second comparator input, and a second comparator level when the second comparator input is at a higher voltage than the first comparator input.

15. The device of claim 14, wherein the comparator further comprises:

a third comparator input, coupled to a third control input, and configured to enable the comparator;

a fourth comparator input, coupled to the second control input, and configured to vary a bias level of the comparator when the first detector logic level is present at the fourth comparator input; and a supply input connected to the switching output and configured to provide a supply voltage to the comparator.

16. The device of claim 14, wherein the logic circuit is configured to generate a first logic circuit level at the logic output when the first logic input is at the first comparator level and the second logic input is at the first detector logic level, and a second logic circuit level when the first logic input is at the second comparator level or when the second logic input is at the second detector logic level.

17. The device according to claim 16, wherein the switching circuit includes first, second and third switches coupled between the first, second, and third switching inputs, respectively, the first switch having a control terminal coupled to the sixth switching input and configured to open or remain open when the sixth switching input is at the first detector logic level and close or remain closed when the sixth switching input is at the second detector logic level, the second switch having a control terminal coupled to the fifth switching input and configured to open or remain open when the fifth switching input is at the second logic circuit level and close or remain closed when the fifth switching input is at the first logic circuit level, and the third switch having a control terminal coupled to the fourth switching input and configured to open or remain open when the fourth switching input is at the first comparator level and close or remain closed when the fourth switching input is at the second comparator level.

* * * * *